(12) United States Patent
Cheng et al.

(10) Patent No.: US 10,109,756 B2
(45) Date of Patent: Oct. 23, 2018

(54) BACKSIDE ILLUMINATED PHOTO-SENSITIVE DEVICE WITH GRADATED BUFFER LAYER

(71) Applicant: Taiwan Semiconductor Manufacturing Company, Ltd., Hsin-Chu (TW)

(72) Inventors: Yu-Hung Cheng, Tainan (TW); Chia-Shiung Tsai, Hsin-Chu (TW); Cheng-Ta Wu, Shueishang Township (TW); Xiaomeng Chen, Baoshan Township (TW); Yen-Chang Chu, Tainan (TW); Yeur-Luen Tu, Taichung (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/824,910

(22) Filed: Aug. 12, 2015

(65) Prior Publication Data

US 2015/0349160 A1    Dec. 3, 2015

Related U.S. Application Data

(62) Division of application No. 13/963,079, filed on Aug. 9, 2013, now Pat. No. 9,153,717.

(51) Int. Cl.
*H01L 31/00* (2006.01)
*H01L 31/0352* (2006.01)
(Continued)

(52) U.S. Cl.
CPC .. *H01L 31/035254* (2013.01); *H01L 27/1464* (2013.01); *H01L 27/14638* (2013.01);
(Continued)

(58) Field of Classification Search
CPC .......... H01L 31/00–31/208; H01L 31/035254; H01L 27/14638; H01L 31/028;
(Continued)

(56) References Cited

U.S. PATENT DOCUMENTS 7,449,712 B2    11/2008    Cha et al.
7,741,665 B2     6/2010    Kang et al.
(Continued)

FOREIGN PATENT DOCUMENTS

JP    2011-018946    1/2011
KR    10-0625944     9/2006

OTHER PUBLICATIONS

Yu-Hung Cheng et al, U.S. Appl. No. 13/427,628, filed Mar. 22, 2012, for "Preforming Enhanced Cleaning in the Formation of MOS Devices," 21 pages of text, 19 pages of drawings.
(Continued)

*Primary Examiner* — Eric Ward
*Assistant Examiner* — Eric Ashbahian
(74) *Attorney, Agent, or Firm* — Haynes and Boone, LLP

(57) ABSTRACT

A photo-sensitive device includes a uniform layer, a gradated buffer layer over the uniform layer, a silicon layer over the gradated buffer layer, a photo-sensitive light-sensing region in the uniform layer and the silicon layer, a device layer on the silicon layer, and a carrier wafer bonded to the device layer.

20 Claims, 4 Drawing Sheets

(51) Int. Cl.
| | |
|---|---|
| *H01L 31/0232* | (2014.01) |
| *H01L 31/18* | (2006.01) |
| *H01L 31/028* | (2006.01) |
| *H01L 31/109* | (2006.01) |
| *H01L 27/146* | (2006.01) |
| *H01L 31/105* | (2006.01) |

(52) U.S. Cl.
CPC ...... *H01L 27/14687* (2013.01); *H01L 31/028* (2013.01); *H01L 31/0232* (2013.01); *H01L 31/02327* (2013.01); *H01L 31/035218* (2013.01); *H01L 31/105* (2013.01); *H01L 31/109* (2013.01); *H01L 31/18* (2013.01); *H01L 31/1892* (2013.01); *Y02E 10/50* (2013.01)

(58) Field of Classification Search
CPC ............. H01L 31/0745; H01L 31/1812; H01L 31/09–31/1116; H01L 31/1055; H01L 31/1037; H01L 27/14–27/14698; H01L 27/14625; H01L 27/14647; H01L 27/14665; H01L 27/146–27/14893
USPC ................................................... 257/292, 53
See application file for complete search history.

(56) References Cited

U.S. PATENT DOCUMENTS

| | | | | |
|---|---|---|---|---|
| 7,829,442 | B2* | 11/2010 | Westhoff | C30B 25/02 257/E21.125 |
| 2004/0266145 | A1* | 12/2004 | Morse | H01L 21/02381 438/481 |
| 2006/0157806 | A1 | 7/2006 | Rhodes | |
| 2007/0001164 | A1 | 1/2007 | Cha | |
| 2007/0018269 | A1* | 1/2007 | Rhodes | H01L 27/14603 257/458 |
| 2007/0053643 | A1* | 3/2007 | West | G02B 6/12004 385/131 |
| 2007/0152289 | A1* | 7/2007 | Morse | H01L 31/028 257/431 |
| 2008/0014669 | A1* | 1/2008 | Reshotko | H01L 31/09 438/33 |
| 2009/0227061 | A1* | 9/2009 | Bateman | H01L 31/022433 438/57 |
| 2012/0049242 | A1* | 3/2012 | Atanackovic | H01L 31/022441 257/184 |
| 2012/0223291 | A1* | 9/2012 | Klem | B82Y 10/00 257/21 |
| 2013/0062663 | A1* | 3/2013 | Yuan | H01L 31/1075 257/188 |
| 2013/0181312 | A1 | 7/2013 | Hoenk | |
| 2013/0248865 | A1* | 9/2013 | Toriyama | H01L 31/1055 257/53 |
| 2013/0280850 | A1* | 10/2013 | Park | H01L 27/14601 438/72 |
| 2014/0120653 | A1* | 5/2014 | Zhao | H01L 31/0232 438/70 |

OTHER PUBLICATIONS

Laura M> Giovane et al, "Correlation Between Leakage Current Density and Threading Dislocation Density in SiGe P—I—N Diodes Grown on Relaxed Graded Buffer Layers," Applied Physics Letters, Jan. 22, 2001, pp. 541-543, vol. 78, No. 4, American Institute of Physics, Cambridge, USA.

Ning Deng et al., "Effect of Si Content in SiGE Islands on the Critical Size for Shape Evolution," Science Direct, 2006, pp. 47-51, Thin Solid Films 513, Beijing, PR China.

Kazuo Nakajima et al., "Phase Diagram of Growth Mode for the SiGe/SI Heterostructure System with Misfit Dislocations," Science Direct, 2004, pp. 372-282, Journal of Crystal Growth 260, Sendai, Japan.

R. Hull et al., "Synthesis and Functionalization of Epitaxial Quantum Dot Nanostructures for Nanoelectronic Architectures," Science Direct, 2008, pp. 160-168, Materials Science in Semiconductor Processing, New York, USA.

KR, "Office Action", Application No. 10-2014-0102583, Inv. Yu-Hung Cheng et al, dated Jan. 14, 2016, 16 pgs.

* cited by examiner

BACKSIDE ILLUMINATED PHOTO-SENSITIVE DEVICE WITH GRADATED BUFFER LAYER

PRIORITY INFORMATION

This application is a divisional of U.S. patent application Ser. No. 13/963,079 filed Aug. 9, 2013 and entitled "Backside Illuminated Photo-sensitive Device with Gradated Buffer Layer," the disclosure of which is hereby incorporated by reference in its entirety.

BACKGROUND

Photo-sensitive devices are used in a variety of electronic devices. For example, an array of photo-sensitive devices can be used to form an image sensor array to be used in a digital camera. A photo-sensitive device is typically includes a light-sensing region within a semiconductor material that transfers energy from photons into electrical energy.

The light-sensing region is typically formed into a semiconductor material through an implantation process to form either a p-i-n junction or a p-n junction. The semiconductor material in which the light-sensing region is formed is usually partially made of germanium in addition to silicon. This provides various benefits to the photo-sensitive device.

The efficiency at which the photo-sensitive device operates is affected by the characteristics of the semiconductor material in which the light-sensing region is formed. When using a semiconductor crystal that is made of silicon germanium, there may be defects in the crystal due to the different lattice constants between silicon and germanium. These defects are sometimes referred to as dislocations. These defects adversely affect the efficiency at which the photo-sensitive device operates. Thus, it is desirable to reduce these defects as much as possible.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
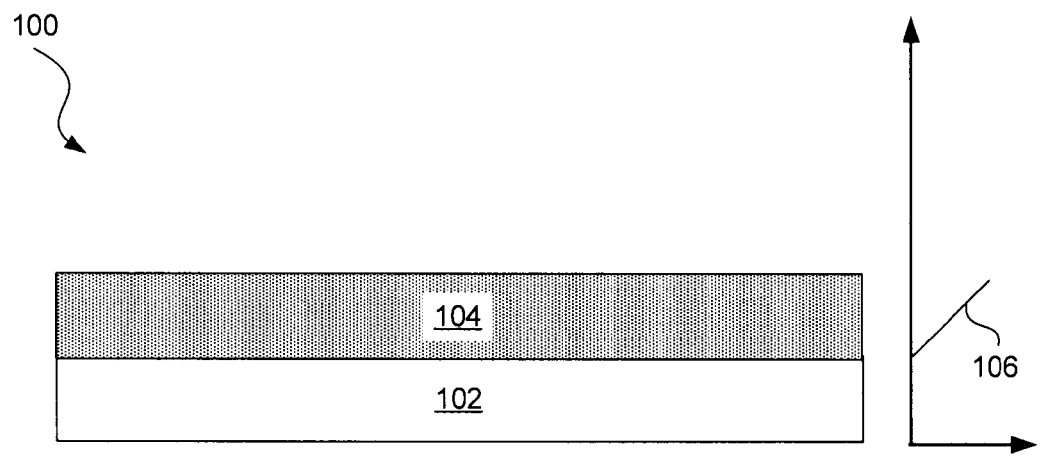
FIGS. 1A-1E are diagrams showing an illustrative formation of a backside illuminated photo-sensitive device with a gradated buffer layer, according to one example of principles described herein.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIGS. 1A-1E are diagrams showing an illustrative formation of a backside illuminated photo-sensitive device 100 with a gradated buffer layer. According to certain illustrative examples, a sacrificial gradated buffer layer 104 is formed onto a sacrificial substrate 102. These layers are referred to as sacrificial because they will eventually be removed as will be discussed in further detail below.

The sacrificial substrate 102 is made of a semiconductor material such as silicon. The sacrificial substrate 102 is used to support an epitaxial growth process to form the gradated buffer layer 104. An epitaxial process is one in which a semiconductor crystal is grown onto an already existing semiconductor material. The epitaxially grown layer is typically formed through use of a gaseous precursor.

The sacrificial gradated buffer layer 104 is made of a semiconductor material that matches the substrate as well as a secondary material. For example, if the semiconductor substrate is made of silicon, then the sacrificial gradated buffer layer 104 is made of silicon and the secondary material. The secondary material is based on the material in which the layer above the buffer layer 104 will be. For example, if the above layer includes germanium, then the secondary material may be germanium.

The sacrificial gradated buffer layer 104 changes in concentration of the secondary material, which in this example is germanium, as it gets farther from the sacrificial substrate 102. For example, the concentration of germanium at the border of the sacrificial gradated buffer layer 104 and the sacrificial substrate 102 is zero. As the sacrificial gradated buffer layer 104 is grown, the concentration of germanium increases.

FIG. 1A illustrates a doping profile in association with the sacrificial substrate 102 and the sacrificial gradated buffer layer 104. The horizontal axis represents the concentration of the secondary material, which in this case germanium. The vertical axis represents the position in along the depth of the photo-sensitive device 100. As illustrated, the doping profile 106 of the sacrificial gradated buffer layer 104 increases in concentration as it moves farther away from the sacrificial substrate 102.

In one example, the gradient of the gradated buffer layer may be an increase of 10% concentration for every 0.1 micrometers of thickness. In some cases, the change in concentration may be within a range of about 5 to 20 percent change in germanium concentration for every 0.1 micrometers in thickness. The overall thickness of the sacrificial gradated buffer layer 104 may be within a range of about 0.1 to 1.0 micrometers. Thus, if the thickness of an illustrative gradated buffer layer is 0.4 micrometers and the gradient is a 10% change per 0.1 micrometers, then the total germanium concentration at the top of the gradated buffer layer 104 would be approximately 40%.

In some examples, the gradient may be such that it changes from 0% germanium to 100% over the thickness of the layer 104. While the doping profile 106 is illustrated as a linear profile, the doping profile 106 may be non-linear. Various methods of forming the epitaxially grown, gradated buffer layer may be used. For example, to reduce stress, the temperature may be lower than would otherwise be used. For example, the process may be performed at a temperature ranging between about 400 and 700 degrees Celsius.

Figure 1B:
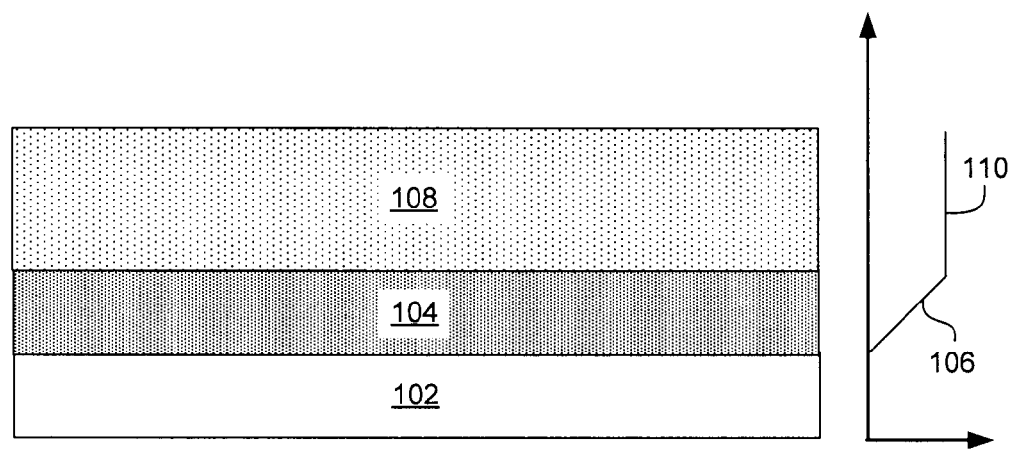

FIG. 1B is a diagram showing an illustrative formation of a uniform layer 108 on top of the sacrificial gradated buffer layer 104. The uniform layer 108 maintains a steady concentration of throughout its thickness. Thus, the doping profile 110 of the uniform layer 108 manifests as a straight line. The uniform layer 108 may have a thickness within a range of about 0.1-2.0 micrometers.

The uniform layer 108 may be made of a variety of materials. In one example, the uniform layer 108 may be made of Silicon Germanium (SiGe). In one example, the uniform layer may be made of pure germanium. In a further example, the uniform layer may be a semiconductor material having a quantum dot or quantum well matrix formed therein. In some examples, a SiGe epitaxy process can allow in-situ doping of p-type or n-type dopants to reduce induced Silicon crystalline damages and improve CIS performance. These dopants may include Boron, Phosphorous or Carbon. The precursor gases to use such dopants in-situ are respectively $B_2H_6$, $PH_3$ and $CH_3SiH_3$.

In the example where the uniform layer 108 is made of silicon germanium, the concentration of germanium may match the concentration of germanium at the top of the sacrificial buffer layer 104. Using the example where the concentration of germanium at the top of the layer is 40%, then the uniform layer 108 will maintain a concentration of 40% germanium throughout the thickness of the uniform layer 108.

In the example where the uniform layer 108 is made of pure germanium, the entire uniform layer 108 will be made of pure germanium. In this case, the sacrificial gradated buffer layer 104 may change from 0 to 100% germanium concentration over its thickness. Thus, the germanium concentration at the top of the buffer layer 104 would match the germanium concentration of the uniform layer 108, which in this case is pure germanium.

Forming the sacrificial graded buffer layer 104 in this manner allows the defects and dislocations resulting from forming one type of crystal on another type of crystal to be "trapped" in the buffer layer. Thus, the defects are mostly formed in an area that is ultimately to be removed. If the uniform layer 108 is formed directly onto the silicon substrate with no buffer layer, then defects or dislocation would be more prevalent throughout the entire uniform layer 108. This would adversely affect the efficiency of a photo-sensitive light-sensing region 118 formed into the uniform layer 108.

In some examples, the uniform layer 108 may have quantum dots or a quantum well formed therein. As will be appreciated by those skilled in the relevant art, quantum dots can be formed into semiconductor materials to aid in the efficiency of photo-sensitive devices. Quantum dots are typically between 5 and 50 nm in size. Quantum dots may be defined by lithographically patterned gate electrodes, or by etching on two-dimensional electron gases in semiconductor heterostructures. A quantum dot matrix or quantum well matrix may be formed into either a silicon germanium uniform layer 108 or a pure germanium uniform layer 108.

Figure 1C:
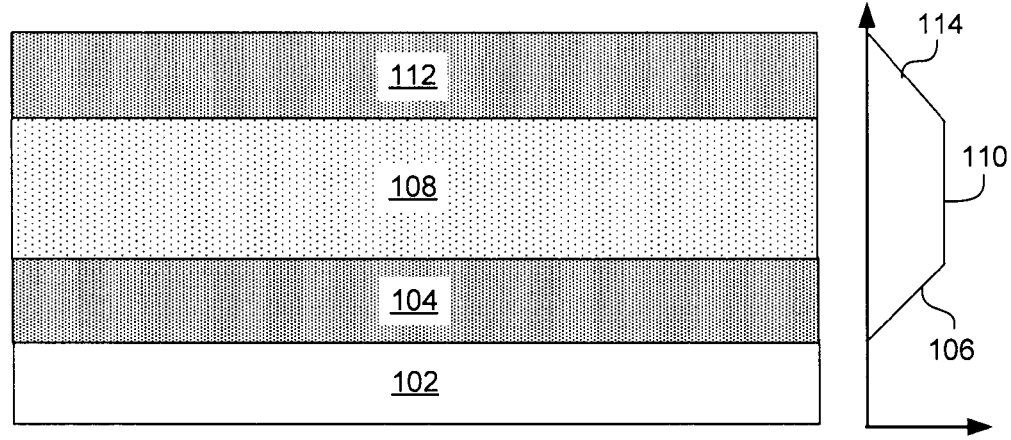

FIG. 1C is a diagram showing an illustrative formation of a second gradated buffer layer 112. The second gradated buffer layer 112 is a reverse gradient of the sacrificial gradated buffer layer 104. As illustrated, the doping profile 114 of the second gradated buffer layer 112 slopes back down to a concentration of zero.

The bottom of the second gradated buffer layer 112 may match the germanium concentration layer of the uniform layer 108. This concentration will slowly be reduced as the secondary graded buffer layer 112 increases in height. Thus, in the example where the uniform layer 108 is 40% germanium, the concentration of germanium at the bottom of the second gradated buffer layer 112 will be 40%. This concentration will be reduced as the height of the second gradated buffer layer 112 increases. In the example where the uniform layer 108 is 100% germanium, the concentration of germanium at the bottom of the second gradated buffer layer 112 will be 100%. This concentration will also be reduced as the height of the second gradated buffer layer 112 increases.

The doping profile 114 of the second gradated buffer layer 112 does not necessarily have to be a mirror image of the doping profile 106 of the sacrificial gradated buffer layer 104. The doping profile 114 is illustrated as a linear profile. However, the doping profile 114 may also be non-linear. The thickness of the second gradated buffer layer 112 may also be within a range of about 0.01 to 0.5 micrometers.

Figure 1D:
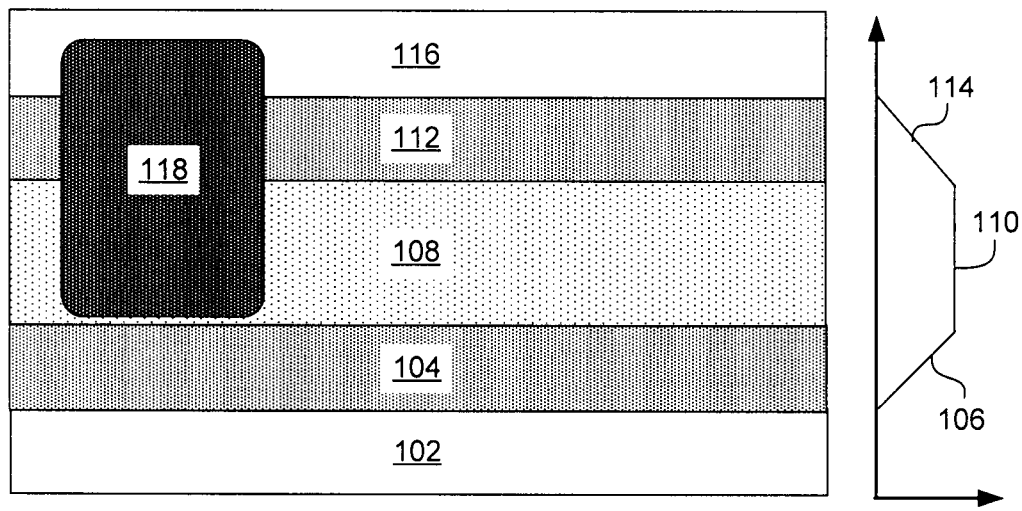

FIG. 1D is a diagram showing an illustrative formation of a pure semiconductor layer 116 on top of the second gradated buffer layer. The pure semiconductor layer 116 is made of the material other than the secondary material of the second gradated buffer layer 112. For example, if the secondary material is germanium, and the remaining material of the second buffer layer 112 is silicon, then the pure semiconductor layer 116 is also made of silicon. The pure semiconductor layer 116 may have a thickness within a range of about 0.01 to 1.0 micrometers.

FIG. 1D also illustrates the formation of a light-sensing region 118 that extends over the uniform layer 108, the second gradated buffer layer 112, and part of the pure semiconductor layer 116. The light-sensing region 118 may be formed through implantation. The light-sensing region 118 may be a p-n junction or a p-i-n junction. Various other components may be formed into the semiconductor layer 116 that connect the light-sensing region 118 to other components such as transistors and other circuit elements that are used to operate in concordance with the light-sensing region 118.

Figure 1E:
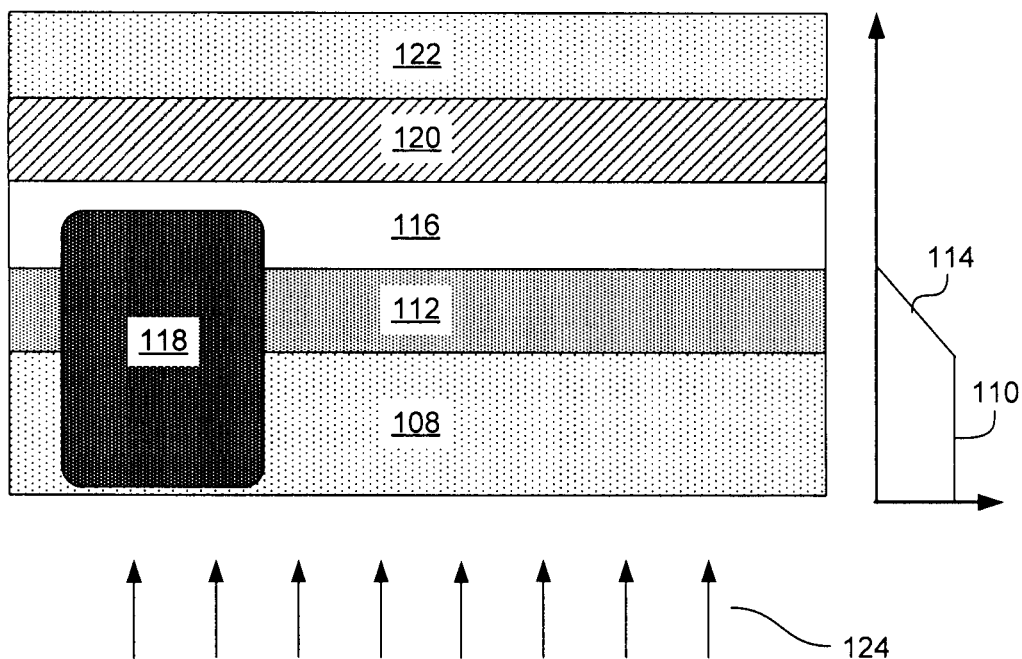

FIG. 1E illustrates the formation of a device layer 120 and a carrier wafer 122 onto the pure semiconductor layer 118.

The device layer 120 is disposed onto the silicon layer 116. Disposing the device layer 120 may include either forming the device layer on the silicon layer 116. Alternatively, disposing the device layer 120 may include forming the device layer 120 separately and then bonding it to the silicon layer 116. With these layers in place, the sacrificial layers 102, 104 can be removed by a removal process 124. Thus, the backside of the light-sensing region 118 is exposed and can sense light being projected onto the backside.

The device layer is fabricated by semiconductor process before or after photo-diode formation. The device layer 120 may include various circuit components and metal interconnects that connect to the light-sensing region 118. For example, in an image sensor array, each light-sensing region 118 is addressed through metal interconnects. Each light-sensing region 118 in the array may correspond to a pixel within an image formed from the image sensor array. Each light-sensing region 118 may thus be associated with specific circuit elements such as transistors to measure the intensity of light at specified wavelengths that impinge upon that light-sensing region 118.

The circuitry within the device layer may be formed using standard photolithographic techniques. For example, a photolithography process may include processing steps of photoresist coating, soft baking, mask aligning, exposing, post-exposure baking, developing photoresist and hard baking. The lithography process may implement krypton fluoride (KrF) excimer lasers, argon fluoride (ArF) excimer lasers, ArF immersion lithography, extreme ultra-violet (EUV) or electron-beam writing (e-beam). The photolithography exposing process may also be implemented or replaced by other proper methods such as maskless photolithography, ion-beam writing, and molecular imprint. When applying the developing solution to the exposed photoresist layer, the sacrificial layer underlying the exposed photoresist region (for positive photoresist) is partially or completely removed as well.

In order to remove the sacrificial layers, the device layer 120 is bonded to a carrier wafer 122. This is because the device layer 120 and all layers below it may not be structurally sufficient to withstand the removal process 124. The removal process may be an etching process or a chemical mechanical polishing (CMP) process. The removal process removes both the sacrificial substrate 102 and the sacrificial gradated buffer layer 104. Thus, all the defects and dislocations resulting from the gradual increase in germanium concentration are removed by the removal process 124. This leaves a uniform layer 108 with relatively few defects or an extraordinarily low defect density. In some cases, a low defect density is defined and the formation of the uniform layer is designed to produce a layer having defects below that threshold using principles described herein. Thus, the light-sensing region 118 formed therein can operate more effectively.

Figure 2A:
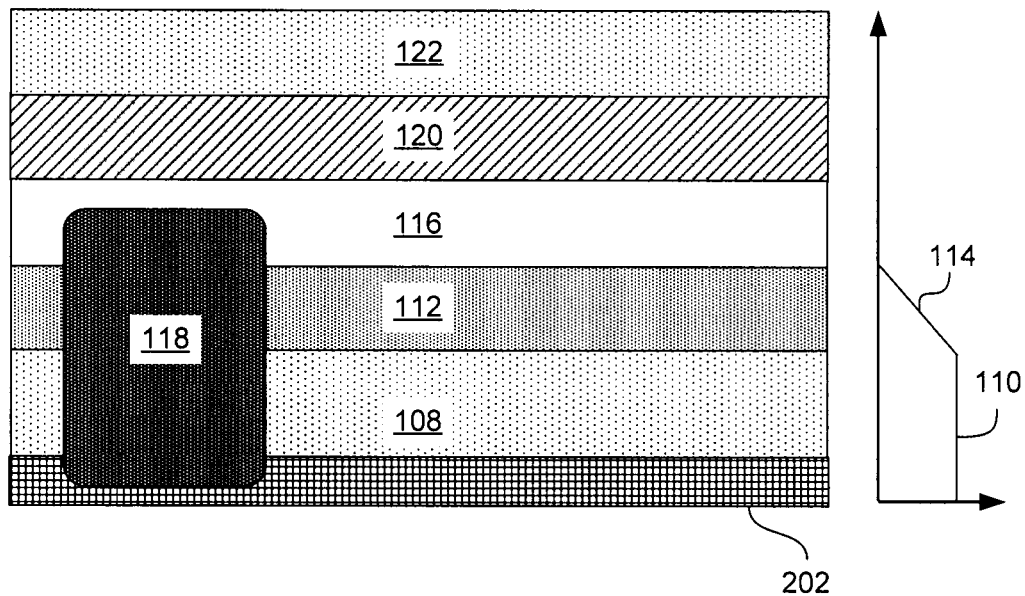
FIG. 2A is a diagram showing an illustrative optical grating structure formed into a uniform layer of the photo-sensitive device, according to one example of principles described herein.

FIG. 2A is a diagram showing an illustrative optical grating structure 202 formed into a uniform layer of the photo-sensitive device. According to certain illustrative examples, an optical grating structure may be formed through use of the quantum dot or quantum well matrix. The optical grating can be formed during the formation of the uniform layer 108. The optical grating 202 layer may be used to filter light to a specific frequency range. For example, the optical grating can be designed to allow "red" light or red-shift light (red-shift means wavelength shifts to longer wavelength) to pass while blocking other colors of light. Thus, the light-sensing region 118 can be used to measure the intensity of "red" light.

Figure 2B:
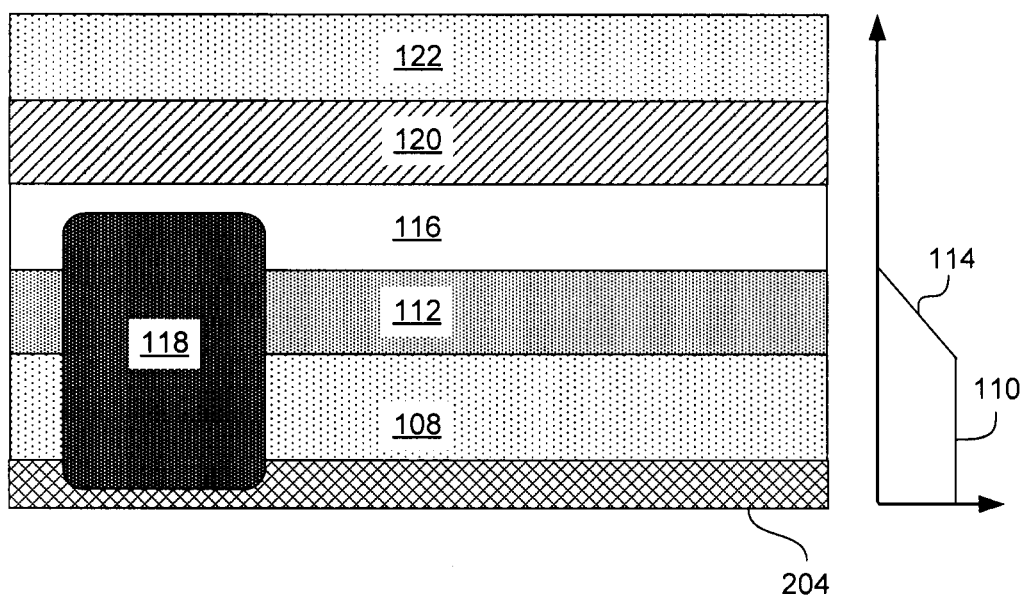
FIG. 2B is a diagram showing an illustrative passivation layer formed into a uniform layer of the photo-sensitive device, according to one example of principles described herein.

FIG. 2B is a diagram showing an illustrative passivation layer 204 formed into a uniform layer of the photo-sensitive device. According to certain illustrative examples, the passivation layer 204 may be formed using a P+ type material such as Boron. The passivation layer may be formed during formation of the uniform layer 108. This may be done by introducing B2H6 into the epitaxial growth process. Thus, the passivation layer is formed in-situ. In addition, in-situ doped Carbon can further cause retardation boron diffusion after the post-epitaxy annealing process.

The passivation layer or P+ type layer 204 may have a thickness and conc. within a range of 10-100 nanometers and $10^{18}$-$10^{21}$ cm-3. The P+ type layer may be made of Boron, for example. The purpose of the passivation layer 204 is to protect the surface of the uniform layer 108 from external contaminants or other things that may cause damage to the uniform layer 108. Moreover, a Boron-rich layer can create a diffusion barrier to prevent interface recombination of photo-induced electrons.

Figure 3:
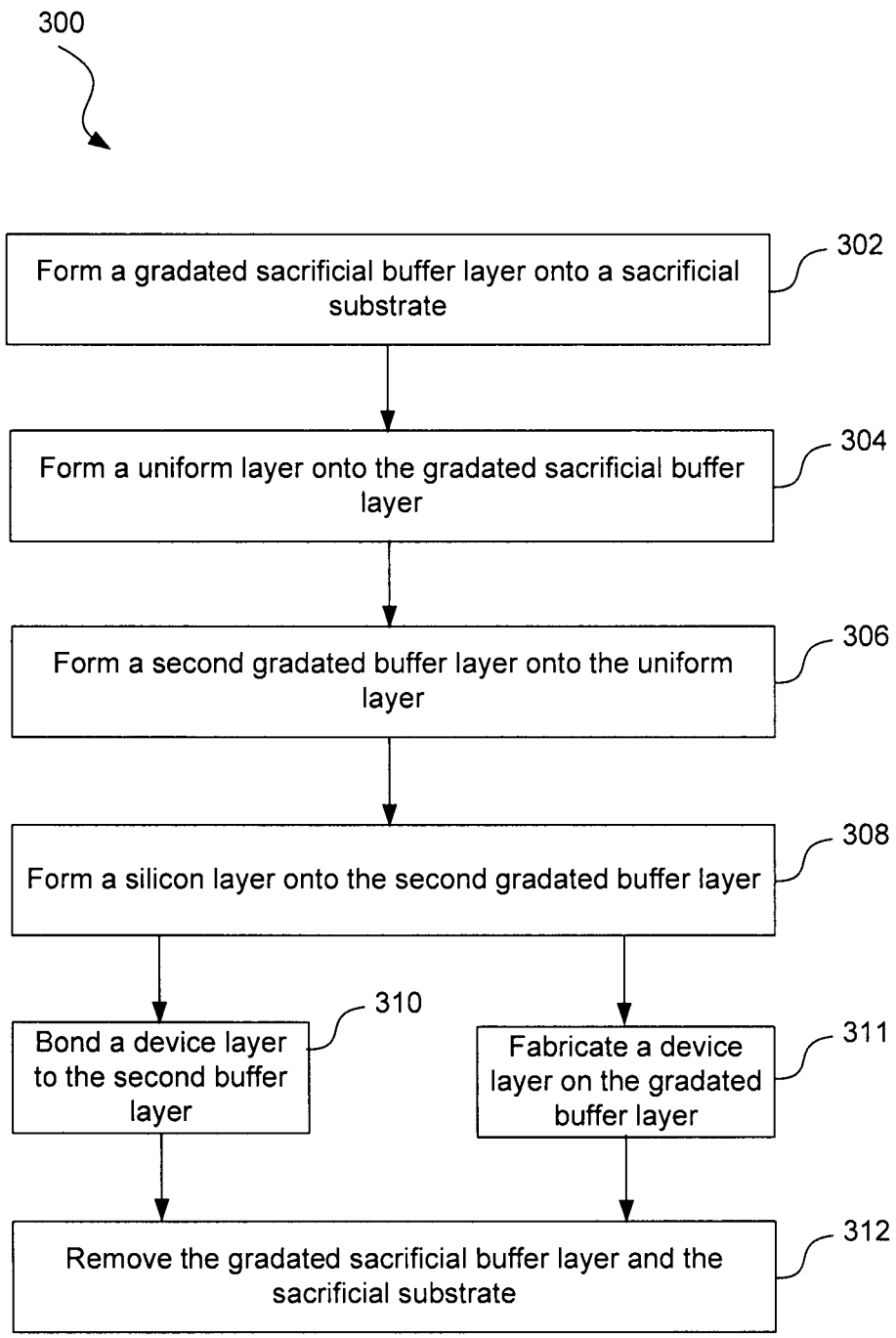
FIG. 3 is a flowchart showing an illustrative method for forming a backside illuminated photo-sensitive device with a gradated buffer layer, according to one example of principles described herein.

FIG. 3 is a flowchart showing an illustrative method for forming a backside illuminated photo-sensitive device with a gradated buffer layer. According to certain illustrative example, a method 300 for forming 302 a backside illuminated photo-sensitive device includes a step for forming a gradated sacrificial buffer layer onto a sacrificial substrate. The method further includes a step for forming 304 a uniform layer onto the gradated sacrificial buffer layer. The method further includes a step for forming 306 a second gradated buffer layer onto the uniform layer. The method further includes a step for forming 308 a silicon layer onto the second gradated buffer layer. The method further includes a step for bonding 310 a device layer to the second buffer layer. Alternatively, the device layer may be formed 311 onto the second gradated buffer layer. The method further includes a step for removing 312 the gradated sacrificial buffer layer and the sacrificial substrate.

According to certain illustrative examples, a method for forming a backside illuminated photo-sensitive device includes forming a gradated sacrificial buffer layer onto a sacrificial substrate, forming a uniform layer onto the gradated sacrificial buffer layer, forming a second gradated buffer layer onto the uniform layer, forming a silicon layer onto the second gradated buffer layer, disposing a device layer on the second buffer layer, and removing the gradated sacrificial buffer layer and the sacrificial substrate.

According to certain illustrative examples, a photo-sensitive device includes a uniform layer a gradated buffer layer over the uniform layer, a silicon layer over the gradated buffer layer, a photo-sensitive light-sensing region 118 in the uniform layer and the silicon layer, a device layer on the silicon layer, and a carrier wafer bonded to the device layer. The defects of the uniform layer are below a defined threshold.

According to certain illustrative examples, a method for forming a backside illuminated photo-sensitive device includes forming a gradated sacrificial buffer layer onto a sacrificial substrate, the gradated sacrificial buffer layer varying in germanium concentration. The method further includes forming a uniform layer onto the gradated sacrificial buffer layer, the uniform layer including an in-situ doped passivation layer adjacent to the gradated sacrificial buffer layer. The method further includes forming a second gradated buffer layer onto the uniform layer, the second gradated buffer layer varying in germanium concentration. The method further includes forming a silicon layer onto the second gradated buffer layer, disposing a device layer on the second silicon layer, forming a photo-sensitive light-sensing region 118 into the uniform layer and the silicon layer, bonding a carrier wafer to the device layer, and removing the gradated sacrificial buffer layer and the sacrificial substrate.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A photo-sensitive device comprising:
   a uniform layer that includes an in-situ doped passivation layer on a first side of the uniform layer;
   a gradated buffer layer over the uniform layer opposite the in-situ doped passivation layer;
   a silicon layer over the gradated buffer layer;
   a device layer on the silicon layer;
   a light-sensing region extending from the in-situ doped passivation layer, through the uniform layer, and partially through the silicon layer such that a portion of the light-sensing region is located within and extends into the in-situ doped passivation layer and a portion of the silicon layer without the light-sensing region extends between the light-sensing region and the device layer, the light-sensing region comprising one of: a p-n junction or a p-i-n junction; and
   a carrier wafer bonded to the device layer.

2. The device of claim 1, wherein the uniform layer comprises at least one of: Silicon Germanium (SiGe), pure Germanium (Ge) and a semiconductor material having quantum dots or a quantum well formed therein.

3. The device of claim 1, wherein the gradated buffer layer includes both silicon and germanium and increases in germanium concentration closer to the uniform layer.

4. The device of claim 1, wherein the gradation of the gradated buffer layer is within a range of about 5-20% change in germanium concentration per 0.1 micrometer.

5. The device of claim 1, wherein the uniform layer comprises a silicon germanium quantum dot or quantum well matrix.

6. The device of claim 1, wherein the in-situ doped passivation layer includes a semiconductor of the uniform layer and in-situ doped boron and carbon.

7. A semiconductor device comprising:
   a uniform semiconductor layer, wherein a passivation layer portion of the uniform semiconductor layer includes a dopant;
   a gradated buffer semiconductor layer on the uniform semiconductor layer opposite the passivation layer portion;
   a silicon layer on the gradated buffer semiconductor layer;
   a device layer disposed directly on the silicon layer; and
   a photosensitive region extending from the passivation layer portion, through the uniform semiconductor layer, entirely through the gradated buffer semiconductor layer, and through the silicon layer, wherein:
      a portion of the photosensitive region is located within and extends into the passivation layer portion; and
      the photosensitive region comprises one of: a p-n junction or a p-i-n junction.

8. The device of claim 7, wherein the uniform semiconductor layer comprises at least one of: Silicon Germanium (SiGe), pure Germanium (Ge), a semiconductor material having quantum dots or a quantum well and in-situ dopants formed therein.

9. The device of claim 7, wherein the photosensitive region is also formed within the silicon layer.

10. The device of claim 7, wherein the gradated buffer semiconductor layer includes both silicon and germanium and increases in germanium concentration closer to the uniform semiconductor layer.

11. The device of claim 7, wherein the gradated buffer semiconductor layer has a thickness within a range of about 0.1 and 1.0 micrometers.

12. The device of claim 7, wherein the uniform semiconductor layer is a thickness within a range of about 0.1-2.0 micrometers.

13. The device of claim 7, wherein the silicon layer is a thickness within a range of about 0.01-1.0 micrometers.

14. The device of claim 7, wherein the gradation of the gradated buffer semiconductor layer is within a range of about 5-20 percent change in germanium concentration per 0.1 micrometer.

15. The device of claim 7, wherein the photosensitive region is also formed within the uniform semiconductor layer.

16. The device of claim 7, wherein the uniform semiconductor layer comprises a silicon germanium quantum dot matrix.

17. The device of claim 7, wherein the passivation layer portion includes boron and carbon.

18. A photo-sensitive device comprising:
   a uniform layer that includes a portion that is in-situ doped to define a passivation layer;
   a gradated buffer layer over the uniform layer opposite the passivation layer;
   a silicon layer over the gradated buffer layer;
   a device layer on the silicon layer;
   a light-sensing region extending partially through the passivation layer, through a remainder of the uniform layer, through the gradated buffer layer, and through the silicon layer, wherein:
      a portion of the light-sensing region is disposed within and extends into the passivation layer; and
      the light-sensing region comprises one of: a p-n junction or a p-i-n junction; and
   a carrier wafer bonded to the device layer.

19. The device of claim 18, wherein the gradated buffer layer includes both silicon and germanium and increases in germanium concentration closer to the uniform layer.

20. The device of claim 18, wherein the gradation of the gradated buffer layer is within a range of about 5-20% change in germanium concentration per 0.1 micrometer.

* * * * *